(12) United States Patent
Sharfi

(10) Patent No.: US 9,382,914 B1
(45) Date of Patent: Jul. 5, 2016

(54) SEALED INTEGRATED LOW PROFILE COOLING ARRAY

(71) Applicant: Benjamin K. Sharfi, Stuart, FL (US)

(72) Inventor: Benjamin K. Sharfi, Stuart, FL (US)

(*) Notice: Subject to any disclaimer, the term of this patent is extended or adjusted under 35 U.S.C. 154(b) by 426 days.

(21) Appl. No.: 13/949,158

(22) Filed: Jul. 23, 2013

Related U.S. Application Data

(60) Provisional application No. 61/675,225, filed on Jul. 24, 2012.

(51) Int. Cl.
*H01L 23/467* (2006.01)
*F04D 19/00* (2006.01)

(52) U.S. Cl.
CPC ............ *F04D 19/002* (2013.01); *H01L 23/467* (2013.01)

(58) Field of Classification Search
None
See application file for complete search history.

(56) References Cited

U.S. PATENT DOCUMENTS

| | | | | |
|---|---|---|---|---|
| 3,196,940 A | * | 7/1965 | Saslow | F04D 25/0613 165/104.34 |
| 6,172,416 B1 | * | 1/2001 | Miyahara | H01L 23/467 165/122 |
| 6,244,331 B1 | * | 6/2001 | Budelman | F28F 3/022 165/121 |
| 7,388,746 B2 | * | 6/2008 | Park | H01L 23/4006 165/80.4 |
| 8,331,091 B2 | * | 12/2012 | Kaslusky | F04D 29/582 165/121 |

* cited by examiner

*Primary Examiner* — Ninh H Nguyen
*Assistant Examiner* — Justin Seabe
(74) *Attorney, Agent, or Firm* — Lott & Fischer, PL

(57) ABSTRACT

A cooling apparatus for an enclosure. A base plate is mounted to the enclosure, with a first and second motor disposed on a first side of the base plate. First and second fans are disposed in a central location on an opposing side of the base plate, and are rotationally coupled to the motors. First and second sets of fins protrude from the base plate, with proximate ends of the fins disposed proximate the first and second fans, and distal ends of the fins disposed proximate a peripheral edge of the base plate. The fins are curved so as to form first and second partial swirl patterns. The fins are disposed in a spaced configuration, where spacing between the fins is greater at the distal ends than it is at the proximate ends. The first set of fins and the second set of fins are disposed adjacent one another in a yin-yang pattern.

8 Claims, 5 Drawing Sheets

SEALED INTEGRATED LOW PROFILE COOLING ARRAY

This application claims priority and benefit of prior U.S. provisional patent application Ser. No. 61/675,225 filed 2012 Jul. 24. This invention relates to the field of cooling apparatuses. More particularly, this invention relates to ruggedized, submersible, forced-convection, cooling devices, such as for electronic assemblies.

FIELD

Introduction

Electronic devices in general, and computers in specific, are becoming increasingly compact and small in size. At the same time that they are getting smaller, they are also getting more powerful, in that they are capable of storing more information and processing data at greater speeds. One result of these two trends is that more heat is generated in a smaller space by such electronic devices.

If the heat is not sufficiently removed from an electronic device, then the build-up of heat within the device tends to have adverse effects. One adverse effect is that the device may tend to run more slowly. Another adverse effect is that the device may become damaged by attaining a temperature at which various components start to fail. Even if components don't fail, the time spent at an increased temperature tends to reduce the viable lifetime of many electronic components.

Because of this, a great deal of attention has been paid to various methods by which electronics can be cooled. However, many of these methods are not effective when the electronic device is disposed in an environment that is not particularly well-suited for such electronics. For example, when the environment is hotter, wetter, dustier, dirtier, or subjected to more vibration, shock, or rough handling than a typical office setting, then additional cooling challenges are introduced.

For example, electronic devices that are protected from such environments by being placed within ruggedized housings can be very difficult to cool, because the cooling system cannot compromise the integrity of the ruggedized housing that is protecting the electronic device from the environment.

What is needed, therefore, is a system that tends to reduce issues such as those described above, at least in part.

SUMMARY OF THE CLAIMS

The above and other needs are met by a cooling apparatus for an enclosure, the cooling apparatus having a base plate for mounting to the enclosure. A first motor is disposed on a first side of the base plate, and a second motor is also disposed on the first side of the base plate. A first fan is disposed on a second opposing side of the base plate, and is rotationally coupled to the first motor. The first fan is disposed in a central location of the base plate. A second fan is disposed on the second side of the base plate, and is rotationally coupled to the second motor. The second fan is disposed in the central location of the base plate. A first set of fins protrudes from the base plate, with proximate ends of the first set of fins disposed proximate the first fan and distal ends of the first set of fins disposed proximate a peripheral edge of the base plate. The first set of fins is curved so as to form a first partial swirl pattern. The first set of fins is disposed in a spaced configuration, where spacing between the first set of fins is greater at the distal ends than it is at the proximate ends. A second set of fins protrudes from the base plate, with proximate ends of the second set of fins disposed proximate the second fan and distal ends of the second set of fins disposed proximate the peripheral edge of the base plate. The second set of fins is curved so as to form a second partial swirl pattern. The second set of fins is disposed in a spaced configuration, where spacing between the second set of fins is greater at the distal ends than it is at the proximate ends. The first set of fins and the second set of fins are disposed adjacent one another in a yin-yang pattern.

In various embodiments, the first set of fins and the second set of fins cover substantially all of the second side of the base plate. In some embodiments a cooling medium is drawn in to the fans in the central location of the base plate and forced outward through the spacing between the fins toward the peripheral edge of the base plate. In some embodiments the cooling medium is ambient air. In some embodiments the cooling medium is water. In some embodiments sealed couplings are disposed in the base plate between the first fan and the first motor and between the second fan and the second motor, and enable mechanical linkage between the fans and the motors while preventing moisture from penetrating the base plate. In some embodiments the base plate and fins are formed from a single block of material. In some embodiments the base plate and fins are formed of a metallic material.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
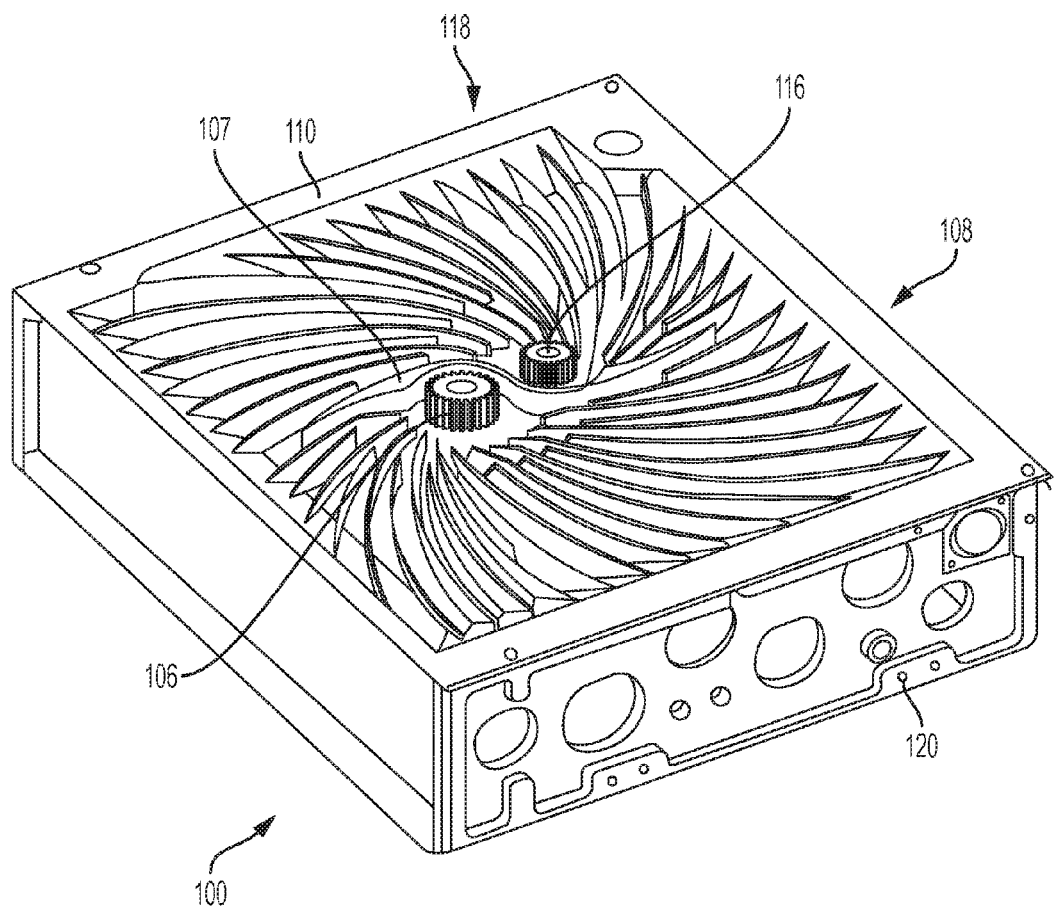
FIG. 1 is a perspective view of a cooling array mounted to an enclosure according to an embodiment of the present invention.
Figure 2:
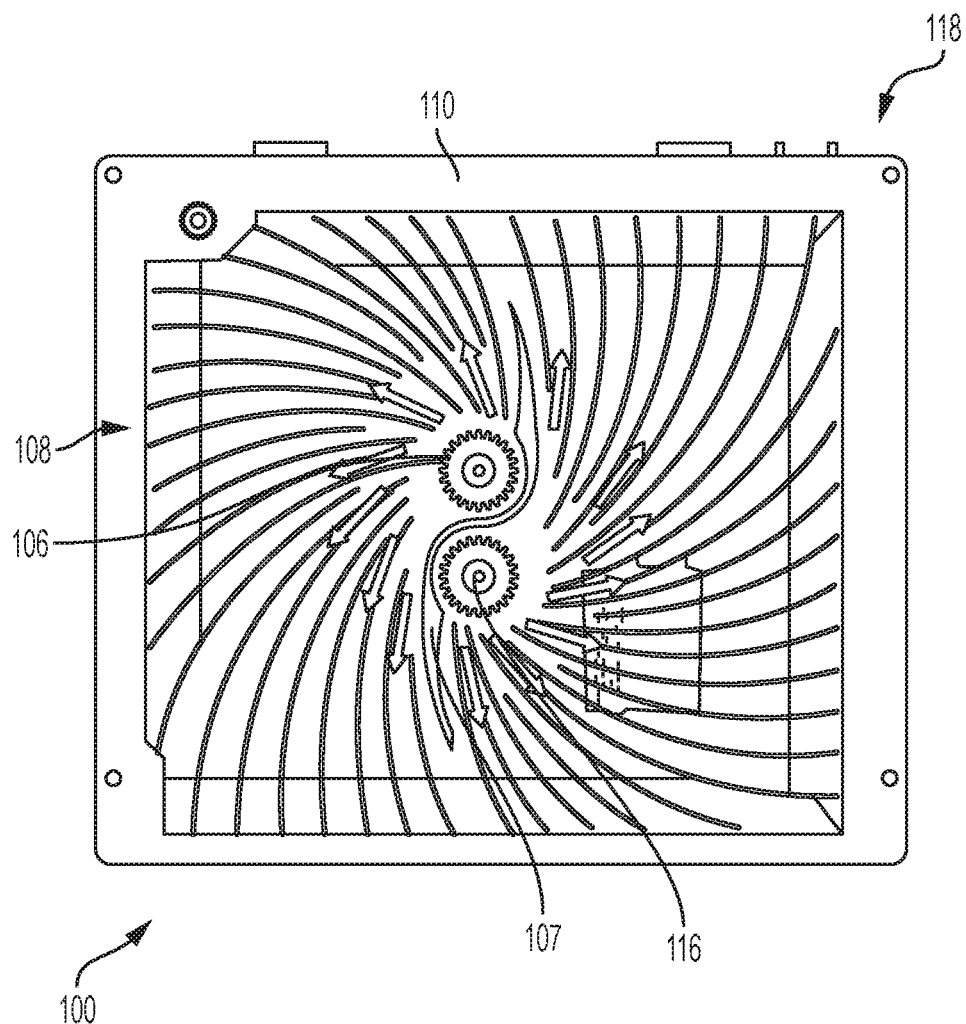
FIG. 2 is a top plan view of a cooling array mounted to an enclosure according to an embodiment of the present invention.
Figure 3:
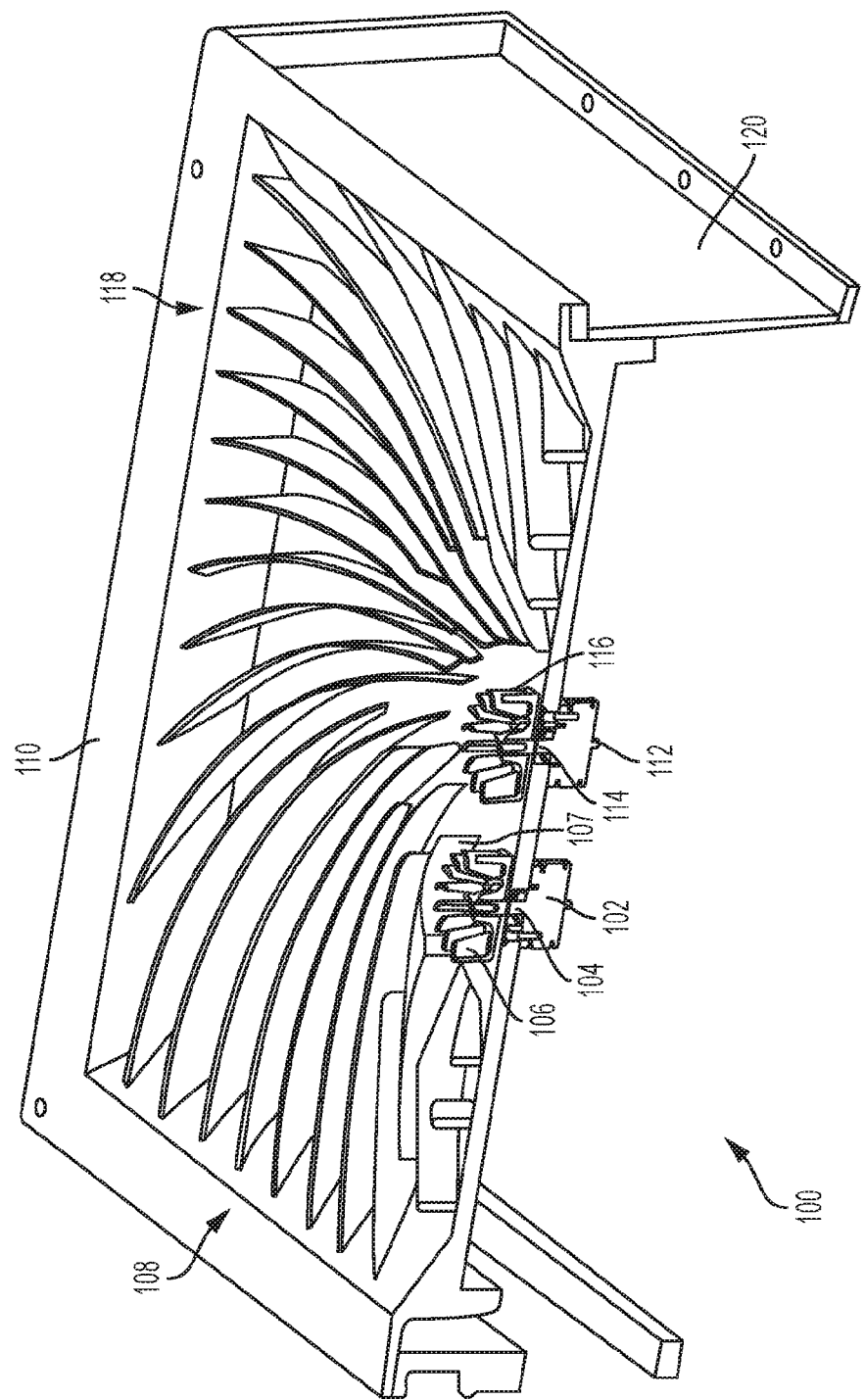
FIG. 3 is a perspective sectional view of a cooling array mounted to an enclosure according to an embodiment of the present invention.
Figure 4:
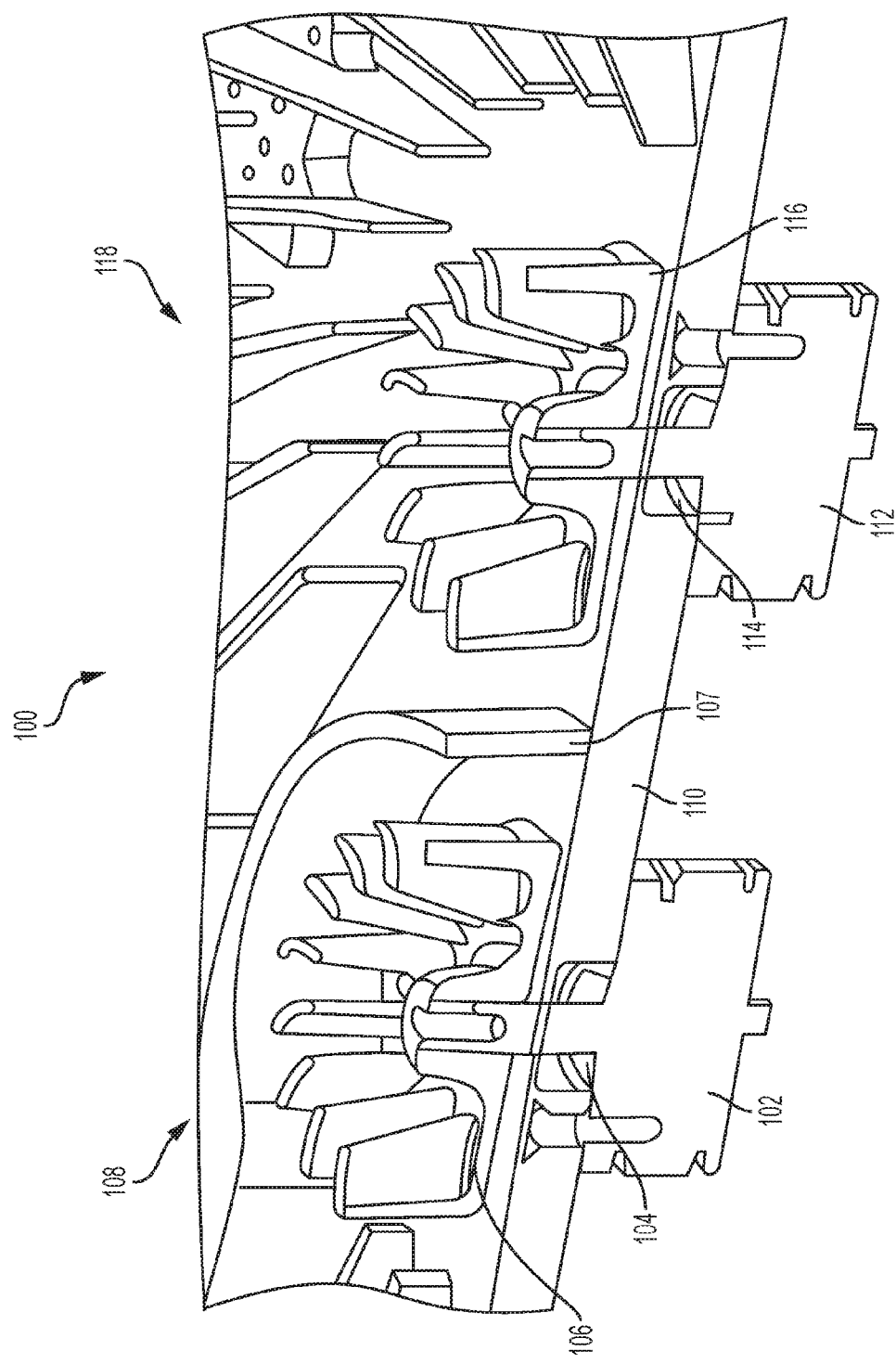
FIG. 4 is an enlarged perspective sectional view of a cooling array mounted to an enclosure according to an embodiment of the present invention.
Figure 5:
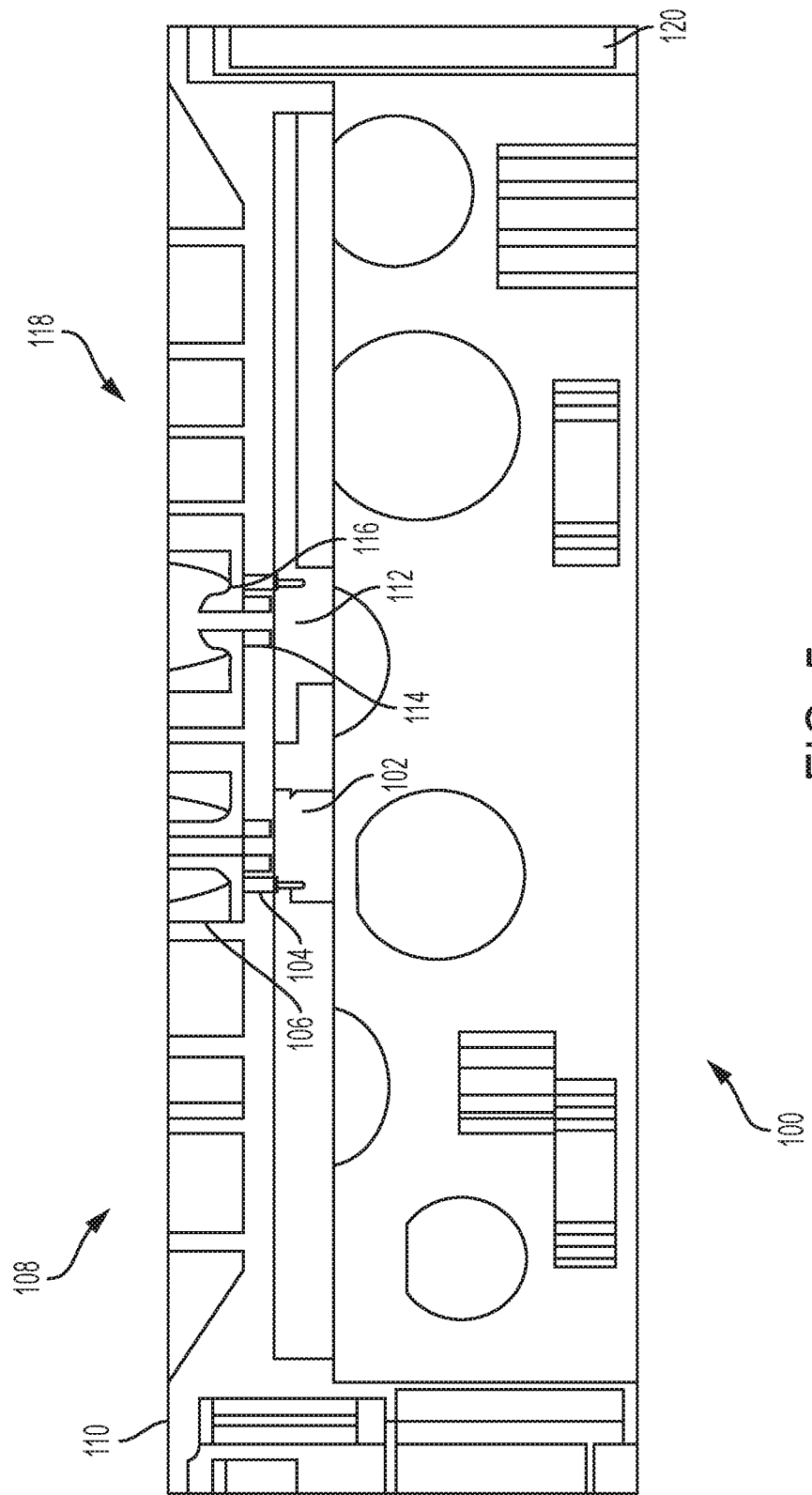
FIG. 5 is an elevational sectional view of a cooling array mounted to an enclosure according to an embodiment of the present invention.

With reference now to the figures, there is depicted a cooling array 100, mounted onto an enclosure 120. In some embodiments the cooling array 100 is integrated into the enclosure 120, such as by forming the top lid of the enclosure 120. In some embodiments the cooling array 100 forms a moisture proof seal between the cooling array 100 and the enclosure 120, such as is sufficient to prevent the penetration of water or air into the enclosure 120. As can be seen in the figures that depict sectional views of the cooling array 100, the cooling array 100 has a relatively low profile in comparison to the enclosure 120, in that the cooling array 100 has a thinner profile than that of the enclosure 120. In some embodiments, the cooling array 100 is disposed substantially within the profile of the enclosure 120, thus the use of the cooling array 100 does not require any significant additional space in order to be used with the enclosure 120.

The cooling array 100 functions to use convection to cool the cooling array 100 on the outside of the enclosure 120, thereby enabling both conductive and convective cooling to occur within the enclosure 120, which cools the electronic devices disposed within the enclosure 120.

The cooling array 100 has a base plate 110, which in some embodiments fastens to the enclosure 120, and in some embodiments forms a part of the enclosure 120. In some embodiments, the base plate 110 is sculpted so as to dip down within the enclosure to some extent, so that other components of the cooling array do not substantially extend up above the top of the enclosure 120. In some embodiments the base plate 110 is formed of metal, or some other material having a thermal conductivity that is sufficient to remove heat from the enclosure at a desired rate.

At least two sets of fins 108 and 118 are disposed on the base plate 110 on the outside of the enclosure 120. The fin sets 108 and 118 form a generally radial pattern, extending from the central portion of the base plate 110 to the peripheral edges of the base plate 110. The spacing between the fins is generally smaller near the central portion of the base plate 110, and generally larger near the peripheral edges of the base plate 110. Each of the two sets 108 and 118 form a partial swirl pattern, where each of the two swirl patterns generally emanates from a different locus. At each of these two loci is disposed a motor and a fan. Thus, there is a first motor 102 and a first fan 106 disposed at the locus of the first set of fins 108, and a second motor 112 and a second fan 116 disposed at the locus of the second set of fins 118. In this manner, the first set of fins 108 and the second set of fins 118 generally form a yin-yang pattern. A separator fin 107 separates the two sets of fins 108 and 118.

The motors 102 and 112 are rotationally coupled to the fans 106 and 116, so that the motors 102, 112 can drive the fans 106, 116. In some embodiments, the fans 106, 116 are driven in a manner such that they draw a cooling medium in from above the cooling array 110, and force it out through the spaces between the fins so that it exits the 10 fins near the peripheral edges of the base plate 110. The two fans 106, 116 move the cooling medium in different directions, each covering half the total base plate 110.

In some embodiments the cooling medium is ambient air, and in some embodiments the cooling medium is water. In some embodiments seals 104 and 114, such as grease seals, are disposed in the base plate 110 between the motors 102 and 112 and the fans 106 and 116. In some of these embodiments, the fans 106, 116 are drive by shafts from the motors 102, 112, and the seals 104, 114 reduce or eliminate the penetration of the cooling medium into the enclosure 120. The circular array 100 allows for shorter air movement through the fin sections, hence less pressure head and more controlled. The motors can vary in size, weight, torque, package, or brand.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A cooling apparatus for an enclosure, the cooling apparatus comprising:
    a base plate, a first motor disposed on a first side of the base plate, a second motor disposed on the first side of the base plate,
    a first fan disposed on a second opposing side of the base plate, and rotationally coupled to the first motor, the first fan disposed in a central location of the base plate;
    a second fan disposed on the second side of the base plate, and rotationally coupled to the second motor, the second fan disposed in the central location of the base plate,
    a first set of fins protruding from the base plate, with proximate ends of the first set of fins disposed proximate the first fan and distal ends of the first set of fins disposed proximate a peripheral edge of the case plate, the first set of fins curved so as to form a first partial swirl pattern, the first set of fins disposed in a spaced configuration, where spacing between the first set of fins is greater at the distal ends than it is at the proximate ends,
    a second set of fins protruding from the base plate, with proximate ends of the second set of fins disposed proximate the second fan and distal ends of the second set of fins disposed proximate the peripheral edge of the base plate, the second set of fins curved so as to form a second partial swirl pattern, the second set of fins disposed in a spaced configuration, where spacing between the second set of fins is greater at the distal ends than it is at the proximate ends, and
    a separator fin protruding from the base plate,
    wherein the first set of fins and the second set of fins are separated by the separator fin such that separator fin is partially disposed between the first fan and the second fan, wherein the separator fin partially encircles the first fan and the second fan.

2. The cooling apparatus of claim 1, wherein the first set of fins and the second set of fins cover substantially all of the second side of the base plate.

3. The cooling apparatus of claim 1, wherein a cooling medium is drawn in to the fans in the central location of the base plate and forced outward through the spacing between the fins toward the peripheral edge of the base plate.

4. The cooling apparatus of claim 3, wherein the cooling medium is ambient air.

5. The cooling apparatus of claim 3, wherein the cooling medium is water.

6. The cooling apparatus of claim 1, further comprising sealed couplings disposed in the base plate between the first fan and the first motor and between the second fan and the second motor, the sealed couplings for enabling mechanical linkage between the fans and the motors while preventing moisture from penetrating the base plate.

7. The cooling apparatus of claim 1, wherein the base plate and fins are formed from a single block of material.

8. The cooling apparatus of claim 1, wherein the base plate and fins are formed of a metallic material.

* * * * *